US007321125B1

(12) United States Patent
Olson et al.

(10) Patent No.: US 7,321,125 B1
(45) Date of Patent: Jan. 22, 2008

(54) TRANSVERSE MAGNETIC FIELD VOLTAGE ISOLATOR

(75) Inventors: James Daniel Olson, San Mateo, CA (US); Jeffery Scott Coffer, Scotts Valley, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 609 days.

(21) Appl. No.: 10/846,312

(22) Filed: May 13, 2004

Related U.S. Application Data

(63) Continuation of application No. 10/114,022, filed on Mar. 29, 2002, now Pat. No. 6,746,566.

(60) Provisional application No. 60/339,487, filed on Dec. 11, 2001.

(51) Int. Cl.
*H01J 37/18* (2006.01)

(52) U.S. Cl. ........................................ 250/441.11

(58) Field of Classification Search ........... 250/441.11
See application file for complete search history.

(56) References Cited

U.S. PATENT DOCUMENTS 2,920,235 A * 1/1960 Bell et al. ..................... 313/7
3,600,065 A 8/1971 Law et al.
4,117,323 A 9/1978 Greer et al.
4,524,261 A 6/1985 Petric et al.
4,528,451 A 7/1985 Petric et al.
4,584,479 A 4/1986 Lamattina et al.
4,607,167 A 8/1986 Petric
4,818,838 A 4/1989 Young et al.
4,837,443 A 6/1989 Young et al.
4,956,024 A 9/1990 Dean et al.
5,103,102 A 4/1992 Economou et al.
5,254,856 A * 10/1993 Matsui et al. .......... 250/441.11
5,416,588 A 5/1995 Ducharme et al.
5,584,994 A 12/1996 Hattori et al.
5,608,526 A 3/1997 Piwonka-Corle et al.
5,928,426 A 7/1999 Aitchison
6,030,486 A 2/2000 Loewenhardt et al.
6,206,971 B1 3/2001 Umotoy et al.
6,214,161 B1 4/2001 Becker et al.
6,471,822 B1 10/2002 Yin et al.

(Continued)

OTHER PUBLICATIONS

TDB, "Mask Overlay Determination" IBM Technical Disclosure Bulletin, Dec. 1978, pp. 272-2773. www.delphion.com.

(Continued)

*Primary Examiner*—Jack I. Berman
(74) *Attorney, Agent, or Firm*—Beyer Weaver LLP

(57) ABSTRACT

A voltage-isolating passageway for providing high voltage isolation between a component maintained at high DC voltage and a component maintained at a substantially lower voltage is described. The voltage-isolating passageway incorporates a transverse magnetic field across its passageway, which reduces the potential energy of charged particles (e.g., electrons) passing through the passageway. The reduction in electron potential energy reduces the energy of collisions between electrons and molecules and therefore reducing the likelihood of avalanche ionization. The voltage-isolating passageway includes a passageway and at least two magnets. The passageway has two openings and the two magnets are positioned along opposite and exterior surfaces of the passageway wherein the first and second magnets impose a magnetic field in a transverse direction with respect to a lengthwise axis of the passageway. In addition, a semi-conductive coating can be applied to the interior passageway surface to help remove potential energy from the gas that comes in direct contact with the coating.

27 Claims, 4 Drawing Sheets

U.S. PATENT DOCUMENTS

| | | | | |
|---|---|---|---|---|
| 6,483,580 | B1 | 11/2002 | Xu et al. | |
| 6,571,821 | B2 | 6/2003 | Matte et al. | |
| 6,716,346 | B1 | 4/2004 | Chang | |
| 6,746,566 | B1 * | 6/2004 | Olson et al. | 156/345.29 |
| 6,982,793 | B1 | 1/2006 | Yang et al. | |
| 2001/0032591 | A1 | 10/2001 | Carducci et al. | |
| 2002/0185067 | A1 | 12/2002 | Upham | |
| 2003/0002043 | A1 | 1/2003 | Abdulhalim et al. | |

OTHER PUBLICATIONS

TDB, “Phase-Sensitive Overlay Analysis Spectrometry” IBM Technical Disclosure Bulletin, Mar. 1990, pp. 170-174. www.delphion.com.

TDB, “Interferometric Method of Checking the Overlay Acccuracy in Photolitho Graphic Exposure Processes” IBM Technical Disclosure Bulletin, Mar. 1990, pp. 214-217. www.delphion.com.

* cited by examiner

TRANSVERSE MAGNETIC FIELD VOLTAGE ISOLATOR

CROSS-REFERENCE TO RELATED APPLICATIONS

This application is a continuation of U.S. patent application Ser. No. 10/114,022, filed Mar. 29, 2002 now U.S. Pat. No. 6,746,566, entitled "Transverse Magnetic Field Voltage Isolator," which claims priority from U.S. Provisional Patent application No. 60/339,487, filed Dec. 11, 2001 entitled "Transverse Magnetic Field Voltage Isolator," both of which are hereby incorporated by reference.

This application is related to U.S. Pat. No. 6,710,354, entitled "Scanning Electron Microscope Architecture and Related Material Handling System," the content of which is hereby incorporated by reference.

FIELD OF THE INVENTION

The present invention relates generally to voltage isolation, and more specifically to magnetic voltage isolation techniques.

BACKGROUND OF THE INVENTION

Avalanche ionization is a physical phenomenon that significantly decreases the operating voltage range of various low-pressure systems. Avalanche ionization typically occurs in low-pressure, gas-filled environments when high potential electrons collide into and break apart molecules into atoms and additional high potential electrons. The additional high potential electrons, in turn, take part in a chain reaction in which more and more molecules are broken apart. This chain reaction causes the gas to change into highly conductive plasma.

Avalanche ionization is problematic, for example, in low-pressure applications (e.g., less than 10 Torr) in which a component that is maintained at a high voltage is separated from another component, which is maintained at ground potential, by a gas-filled passageway. When avalanche ionization occurs within the gas-filled chamber, the created plasma forms an electrical pathway between the separated components, which drains the voltage from the high-voltage component. The plasma effectively short circuits the components and prevents high-voltage operation.

Exemplary applications of low-pressure applications include semiconductor fabrication systems, electron microscopes, and space-based ion propulsion systems. In semiconductor fabrication systems, the wafer and the chuck holding the wafer are maintained at very high voltages, typically in the range of thousands of volts, and a connected vacuum pump is at ground potential. In electron microscopes, the microscope is maintained at a high voltage and a connected vacuum pump is at ground potential. In the case of an ion engine, an ion source, typically maintained at a high voltage, is connected to a gas-feed system at ground potential. In each type of system, it is desirable to prevent avalanche conditions by increasing the threshold voltage at which plasma ionization occurs.

Currently, approaches for preventing avalanche ionization have been implemented. However, these techniques have certain drawbacks that leave the industry wanting for a more superior method. For instance, one current technique involves separating the high voltage source and the nearest ground by a large distance. This technique is impractical, however, because the necessary distances are typically infeasible in light of physical space limitations. Another technique involves separating the high voltage component and the grounded component by forming part of the gas chamber that connects the components with an electrically insulating material. Unfortunately, this technique is simply not very effective in reducing the breakdown threshold voltage. Yet another technique involves placing a porous dielectric material in the line between the high voltage component and the grounded component to obstruct the path in which high potential electrons can travel. The dielectric material reduces the potential of the electrons, however, it also significantly impedes the flow of gas. In the case where the bias is of an A/C nature, a faraday cup has been used with limited success.

In view of the foregoing, techniques for effectively increasing the voltage level at which avalanche ionization occurs in low-pressure applications would be desirable.

BRIEF SUMMARY OF THE INVENTION

The present invention is directed to techniques for increasing the voltage level at which avalanche ionization occurs in low-pressure applications. The invention essentially creates a transverse magnetic field across a gas passageway, which reduces the potential energy of charged particles (e.g., electrons) passing through the passageway. The reduction in electron potential energy reduces the energy of collisions between electrons and molecules and therefore reduces the likelihood of avalanche ionization.

One aspect of the invention pertains to a voltage-isolating apparatus that includes at least two passageways and a first and a second magnet. Each passageway has two openings wherein each opening is configured to be connected to external components and is capable of being sealed such that a low pressure environment can be sustained within each passageway. The first and the second magnet are positioned along opposite and exterior surfaces of each of the passageways wherein the first and second magnets impose a magnetic field in a transverse direction with respect to a lengthwise axis of each of the passageways. The transverse magnetic field reduces the potential energy of charged particles traveling through each of the passageways.

Another aspect of the present invention pertains to a high voltage system having at least two components that are each maintained at different voltage biases. The system includes a vacuum chamber, a vacuum pump, and at least two voltage-isolating passageways, and a first and a second magnet. The vacuum chamber is maintained at a very high DC electrical potential and the vacuum pump is maintained at a potential that is lower than the potential at which the vacuum chamber is maintained. The two voltage-isolating passageways are each connected to the vacuum chamber and the vacuum pump and include two openings wherein each opening has vacuum fitting seals. One of the openings of each passageway is configured to be connected to the vacuum chamber and the other opening configured to be connected to the vacuum pump such that a vacuum can be sustained within each passageway. The first and second magnet are positioned along opposite and exterior surfaces of the passageways wherein the first and second magnets impose a magnetic field in a transverse direction with respect to a lengthwise axis of each passageway.

Another aspect of the present invention pertains to a method that involves at least guiding a gas along at least two pathways such that the gas flows from a first external component to a second external component and directing a magnetic field through each of the pathways in a transverse direction with respect to a lengthwise axis of each of the pathways in order to reduce the potential energy of charged particles within the gas as the gas travels through each of the pathways.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for increasing the breakdown threshold voltage at which avalanche ionization can occur within low-pressure environments. One specific implementation of the invention involves providing high voltage isolation between a vacuum chamber and a vacuum pump in pressure range of approximately 1 milli-Torr-1 Torr with little or no current load on the voltage source and without impeding the flow of gas from a vacuum chamber to a vacuum pump. The invention creates a transverse magnetic field across a gas passageway, which reduces the potential energy of charged particles (e.g., electrons) passing through the passageway. The reduction in electron potential energy reduces the energy of collisions between electrons and molecules and therefore the likelihood of avalanche ionization. For descriptions of implementations using the voltage-isolation system of the present invention, see U.S. patent application Ser. No. 10/052,307, entitled "Scanning Electron Microscope Architecture and Related Material Handling System."

Figure 1:
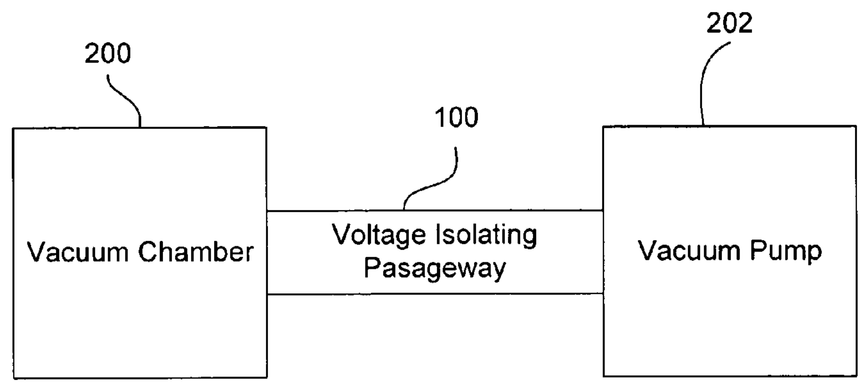
FIG. 1 illustrates a block diagram showing the basic concept wherein voltage-isolation passageway system connects two components.

FIG. 1 illustrates a block diagram showing the basic arrangement in which a voltage-isolating passageway system 100 of the present invention can be utilized. In FIG. 1, passageway system 100 connects two components 200 and 202. In a specific embodiment, component 200 is a vacuum chamber and component 202 is a vacuum pump that pumps down the pressure of vacuum chamber 200 through passageway system 100. Various devices can operate within vacuum chamber 200. For example, a scanning electron microscope or a semiconductor-manufacturing device can operate within vacuum chamber 200. Typically, the device within vacuum chamber 200 is biased at a very high voltage while vacuum pump 202 is grounded at substantially 0 Volts. For example, a typical electron microscope may operate at −5000 Volts. Voltage-isolating system 100 acts to substantially prevent current flow between components 200 and 202 so that the components do not short-circuit each other.

Figure 2:
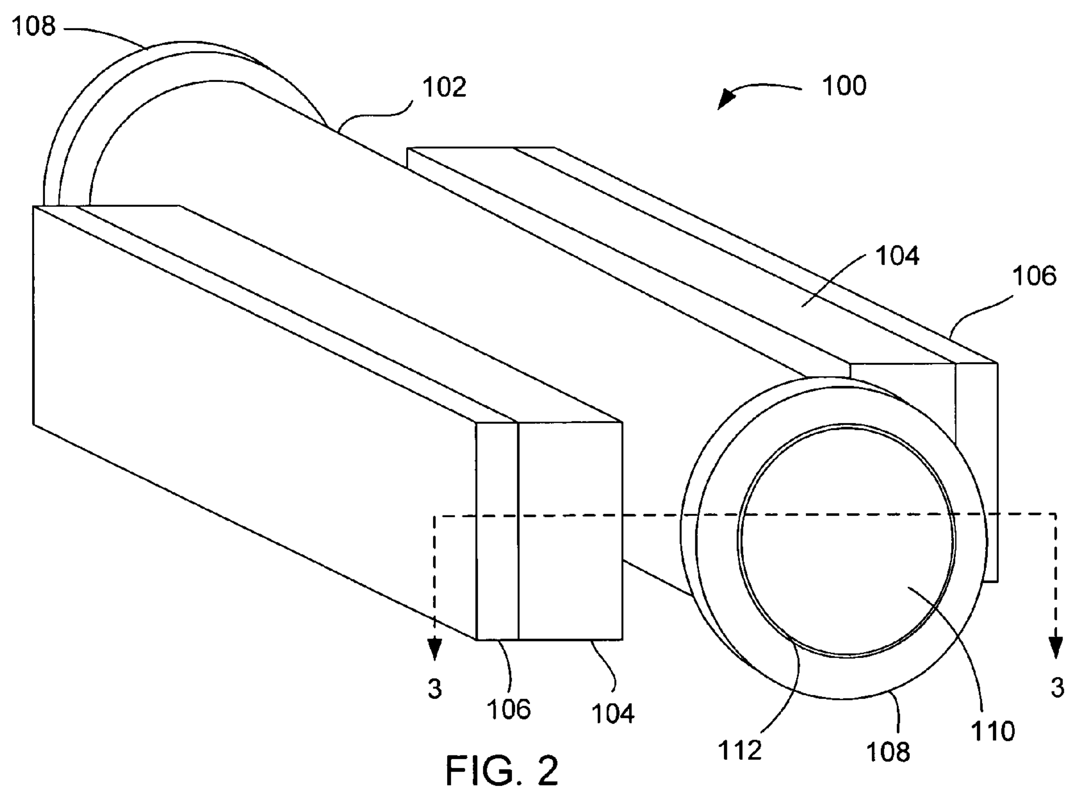
FIG. 2 illustrates a perspective view of a voltage-isolating passageway system according to one embodiment of the present invention.
Figure 3:
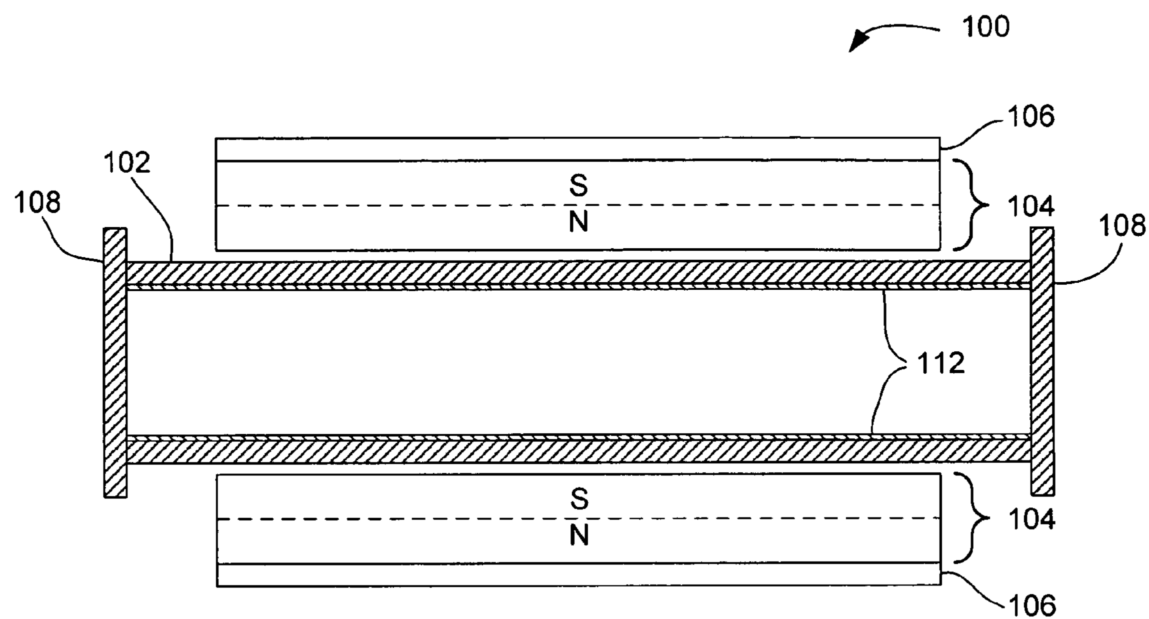
FIG. 3 illustrates a cross-sectional view of system along line 3-3 in FIG. 2.

FIG. 2 illustrates a perspective view of voltage-isolating passageway system 100 of FIG. 1, according to one embodiment of the present invention. FIG. 3 illustrates a cross-sectional view of system 100 along line 3-3 in FIG. 2. Passageway system 100 includes a passageway 102 and two magnets 104 positioned about the outer walls of passageway 102. Passageway 102 has a seal 108 at each opening 110. Pole pieces 106 are attached to the outside surfaces of magnets 104. The inner surface of passageway 102 is coated with a semi-conductive coating 112.

Passageway 102 is a tube through which gas can travel. Seals 108 help maintain the vacuum created within the chambers connected by passageway 102. Seals 108 can be, for example, O-ring seals. Passageway 102 can be of a variety of shapes even though, for exemplary purposes, passageway 102 is shown to have a tubular configuration. Passageway 102 is preferably made of electrically non-conductive materials such as polycarbonate materials.

As seen in FIG. 3, magnets 104 are bar magnets that are oriented so that their poles face the same direction. In this orientation, opposite poles of each magnet 104 face each other and across passageway 102. The north and south poles that face each other across passageway 102 create a magnetic field in the direction transverse to the length of passageway 102. As will be describe in more detail below, the transverse magnetic field will reduce the potential energy of free electrons moving through passageway 102 since it applies a force that is orthogonal to the electron's direction of movement. Magnets 104 can be a single bar magnet having a length equal to a substantial length of passageway 102 as shown in FIG. 3, or each magnet 104 can be substituted with a plurality of individual smaller magnets. Of course, when individual magnets are used, their poles must still be oriented so that opposite poles face each other across passageway 102. Magnets 104 are permanent magnets, however, electrically powered magnets could also be used. Magnets 104 can be made of rare earth materials. In general, the length and strength of the magnetic field dictate the amount of voltage isolation that can be achieved. Longer fields and stronger magnets both produce higher levels of voltage isolation. For particular applications that require less voltage isolation, shorter magnets can be used. For the application of an electron microscope, magnets 104 create a transverse magnetic field of at least 2250 Gauss. Magnetic fields stronger than 2250 Gauss can provide higher levels of voltage isolation, thereby allowing isolated components to operate at voltages greater than 7000 Volts DC.

Pole pieces 106 are attached to the outer surface of magnets 104 in order to direct the magnetic field direction in the transverse direction with respect to the length of passageway 102. Pole pieces can be formed of iron or other suitable materials and alloys.

Semi-conductive coating 112 has a very high resistance that keeps any current flow between each end of passageway 102 to a minimum. Coating 112 gives passageway 102 an end-to-end nominal resistance of approximately 115 Mega Ohms. This corresponds to a nominal surface resistance of 60 Mega Ohms square. Preferably, coating 112 is a mixed metal oxide in an acrylic polymer carrier. The acrylic polymer carrier prevents evaporation and contamination of coating 112. The end-to-end resistance of passageway 102 can vary depending upon the characteristics of coating 112. For instance, the use of various materials can affect the resistance of coating 112. Semi-conductor coating 112 can be applied to the inner surface of passageway 102 by spray application techniques.

In an embodiment of system 100 in which passageway 102 is used to connect a vacuum chamber and a vacuum pump, passageway 102 is a polycarbonate tube that is approximately six inches long, having an outer diameter of 1.25 inches, and having a wall thickness of ⅛ inches. The magnets 104 that are mounted to passageway 102 are 12 individual magnet pieces, that are 1"×1"×0.5" in dimension, 35 grade, and formed of neodymium rare earth magnets. Each of the 12 magnets are arranged into two bar magnets wherein each of the bars are placed on one side of passageway 102. Each of the bars are created by attaching six magnets to a 6"×1"×⅜" piece of C1018 cold-rolled piece of steel. This embodiment of voltage isolation system 100 can effectively increase the threshold breakdown voltage, at any pressure, thereby allowing a high voltage system to operate at higher voltages.

Figure 4:
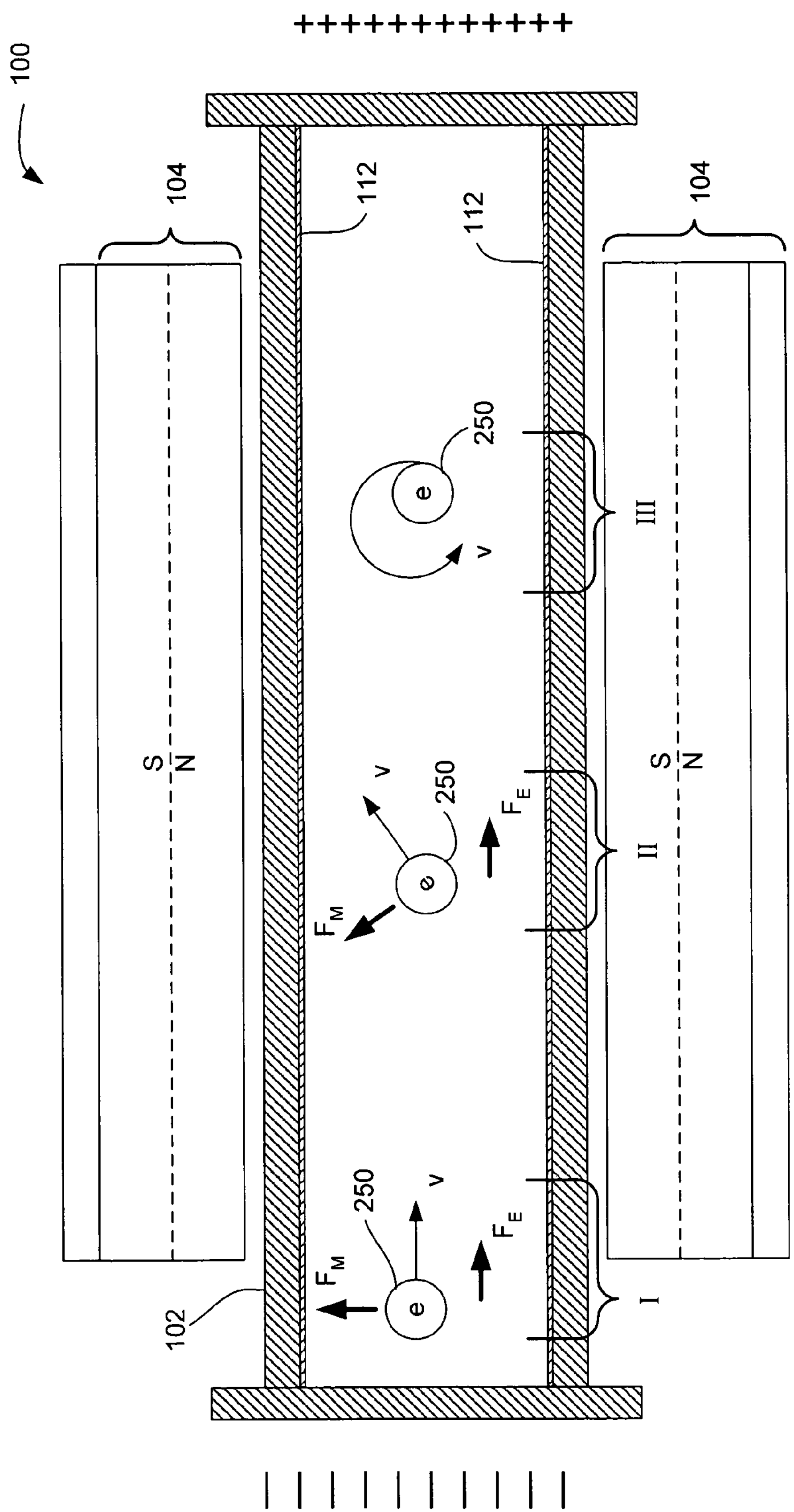
FIG. 4 presents an enlarged cross-sectional view of voltage-isolating passageway system to describe how the transverse magnetic field reduces the potential energy of the charged particles that pass through the passageway.

FIG. 4 presents an enlarged cross-sectional view of voltage-isolating passageway system 100 to describe how the transverse magnetic field reduces the potential energy of the charged particles that pass through the passageway. FIG. 4 represents a passageway system 100 wherein the left side is connected to a component that is maintained at a high negative DC voltage and the right side is connected to a component that is maintained at a ground potential. For example, the left side is connected to an electron microscope and the right side is connected to a vacuum pump. The negative and positive signs on each side of passageway 102 represent the negative and ground potentials. Both the suction of the pump and the electrical force, $F_E$, caused by the electrical bias across the passageway 102, accelerate free electrons along the longitudinal axis and from the left to the right end of passageway 102. These forces cause electrons to travel at very high speeds, and therefore, to have very high potential energies. Again, avalanche ionization is caused when these electrons begin to collide and break apart molecules, thereby creating more high-energy electrons that will break apart additional molecules.

A single electron 250, progressing through three basic stages (I, II, and III), is shown within passageway 102 to describe how the transverse magnetic field, $F_M$, reduces the potential energy of the traveling electrons. Stage I, represents the initial stage in which electron 250 enters passageway 102 and is accelerated towards the right end of passageway 102 such that it has a velocity, v. Upon entering passageway 102, electron 250 has a velocity, v that is substantially in the direction of the passageway's longitudinal axis. However, as shown in stage II, as electron 250 enters into the transverse magnetic field created by magnets 104, the force of the magnetic field, represented by $F_M$, accelerates electron 250 in a direction orthogonal to velocity, v. $F_M$ represents the direction of the magnetic field. Since, the magnetic force on an electron remains orthogonal to the direction of the moving electron, magnetic force $F_M$ causes electron 250 to move in a cyclical path while traveling through passageway 102. Stage III represents the cyclical path in which electron 250 travels, as caused by $F_M$. While travelling in the cycloidic path, the electron is accelerated for one half of the cycle and decelerated for the other half, with respect to the longitudinal axis of passageway 102. As a result, the velocity of electron 250, and therefore its potential energy is greatly reduced. Collisions with the spinning electron 250 now occur at greatly reduced energy. This reduces the possibility that a collision between electron 250 and a molecule would result in the beginning of avalanche ionization.

Semi-conductive coating 112 also detracts from avalanche ionization conditions by absorbing electrons that make contact with the coating, thus reducing the amount of potential energy available. Note that the transverse magnetic force increases the number of electrons that will make contact with coating 112 by forcing electrons towards one side of the inner surface of passageway 102. Effectively, semi-conductive coating 112 reduces the total number of free electrons within the gas, thereby reducing the number electron/molecule collisions. Semi-conductive coating 112 provides a high impedance and direct current path for the absorbed electrons in which the electrons can be conducted toward the ground potential in a controlled and predictable manner. The impedance of coating 112 is sufficiently large that the flow of current through passageway 102 causes only a negligible drop in voltage between the components on either end of system 100.

Voltage-isolating system 100 is effective with or without semi-conductive coating 112. However, for significantly higher voltage isolation, it is preferable to utilize both the magnets 104 and the semi-conductive coating 112. In some embodiments, passageway 102 can be extruded with a conductive doping so that the need to coat the passageway with the semi-conductive coating is eliminated.

Depending upon the voltage isolation and pressure requirements of specific implementations, the length and shape of the passageway can be adjusted accordingly. Also, the field strength and the arrangement of the magnetic poles can be positioned to obtain different levels of voltage isolation.

The effectiveness of the voltage-isolation passageway system of the invention allows the passageway connecting a vacuum chamber and a vacuum pump to be relatively short in length and presents no significant impedance of the flow of the gas. This is particularly advantageous in conditions where space, for example, in a manufacturing plant, is at a premium.

Figure 5:
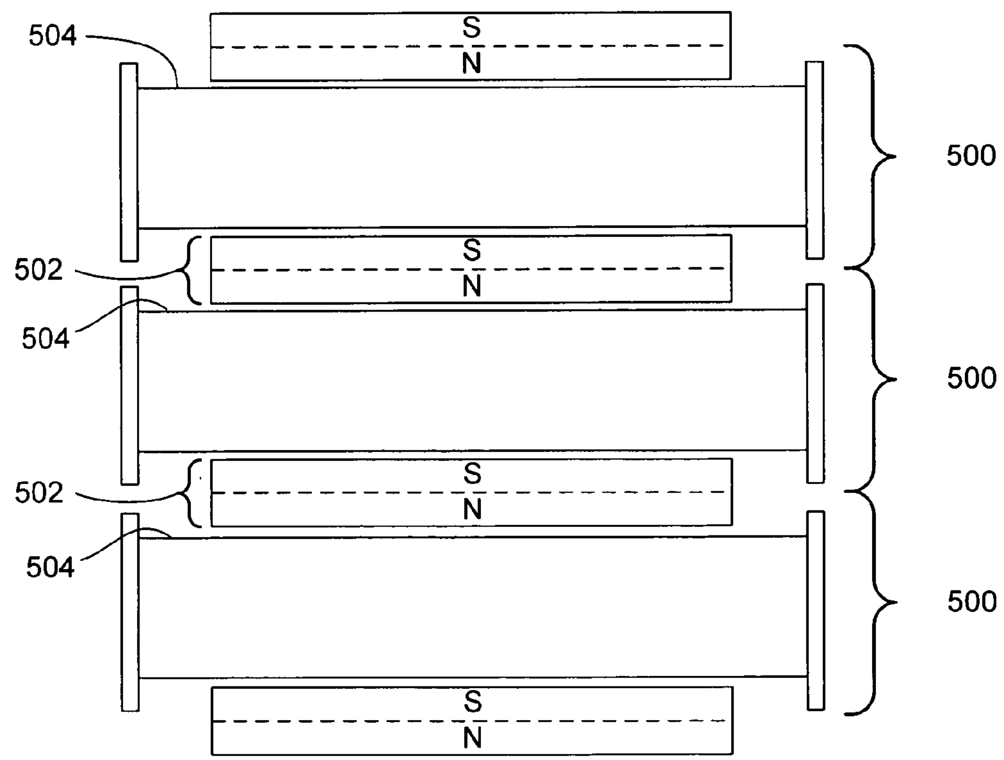
FIG. 5 illustrates an alternative embodiment of the present invention in which three voltage-isolation passageway systems are aligned in parallel.

FIG. 5 illustrates an alternative embodiment of the present invention in which three voltage-isolation passageway systems 500 are aligned in parallel. The arrangement in FIG. 5 is useful in systems in which different levels of low-pressure environments are maintained during the operation of a vacuum system. For instance, each passageway 504 can connect a respective vacuum pump to a respective vacuum chamber. In the parallel arrangement, the north and south poles of each magnet 502 are positioned to face adjacent passageways 504. With this arrangement, it is no longer necessary to have a pole piece for each magnet.

For description of an implementation using the voltage-isolation passageway system of the present invention, see U.S. patent application Ser. No. 10/052,307, entitled "Scanning Electron Microscope Architecture and Related Material Handling System."

Figure 6:
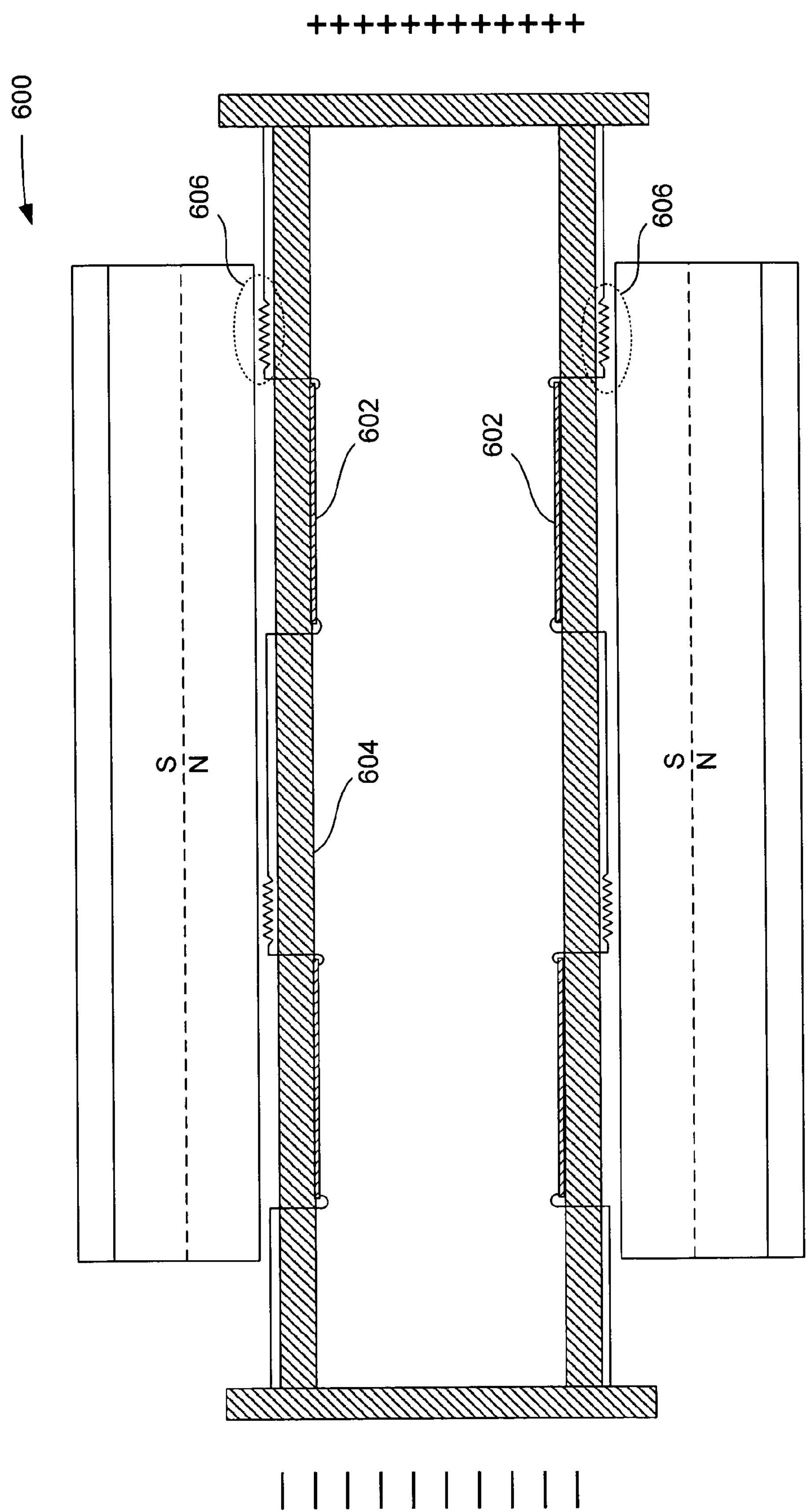
FIG. 6 illustrates a voltage isolation passageway system according to another alternative embodiment of the invention.

FIG. 6 illustrates a voltage isolation passageway system 600 according to another alternative embodiment of the invention. System 600 has a series circuit of discrete strips of semi-conductive coating 602 on the inner surface of passageway 604 that are connected to external resistors 606. The series circuitry connects the opposite ends of passageway 102 such that the voltage drop occurs in measured amounts along the length of passageway 102 as determined by resistors 606. As with the semi-conductive coating that covers the entire length of the passageway, the discrete strips of semi-conductive coating 602 also collect free electrons so to remove them from the flowing gas. In this configuration the bias potential can be actively monitored along the length of the pathway.

An alternative application of the invention utilizes a magnetic field to isolate selected regions of a substrate from plasma formed through avalanche ionization. This application relates to the industrial plastics industry, which uses plasma as a means to modify the surface of a substrate in order to enhance the bonding of an unlike and or incompatible material to their product, i.e. paint on plastic, Teflon coating on silicon rubber, etc. In some cases it is necessary to shield a portion of the whole substrate from the effects of the plasma chemistry. A magnetic field could be easily adapted to any shape and likewise and be positioned to prevent a plasma from being formed within its field, thus creating a plasma shadow zone to protect sensitive areas of the substrate from the surface modifications due to direct exposure to plasma. This process is typically achieved with masking material that is costly and labor intensive.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A voltage-isolating apparatus comprising:

at least two passageways, wherein each passageway is a continuous tubular structure and wherein each passageway having two openings wherein each opening is configured to be connected to external components and capable of being sealed such that a low pressure environment can be sustained within each passageway; and a first and a second magnet positioned along opposite and exterior surfaces of each of the passageways wherein the first and second magnets impose a magnetic field in a transverse direction with respect to a lengthwise axis of each of the passageways, the transverse magnetic field tending to reduce the potential energy of charged particles traveling through each of the passageways.

2. A voltage-isolating apparatus as recited in claim 1 wherein the passageways substantially run along side each other.

3. A voltage-isolating apparatus as recited in claim 1 wherein each continuous tubular structure has an inner diameter of equal to or less than approximately 1 inch.

4. A voltage-isolating apparatus as recited in claim 3 wherein each continuous tubular structure has an inner diameter of approximately ⅛ inch.

5. A voltage-isolating apparatus as recited in claim 1 wherein one external component is a gas-feed system, wherein one of the openings of each of the passageways is connected to the gas-feed system.

6. A voltage-isolating apparatus as recited in claim 5 wherein a gas flows through each of the passageways.

7. A voltage-isolating apparatus as recited in claim 1 wherein the first and second magnets are oriented such that opposite poles face each other across the passageway.

8. A voltage-isolating apparatus as recited in claim 1 wherein the passageway is approximately 6 inches long.

9. A voltage-isolating apparatus comprising:

at least two passageways, each passageway having two openings wherein each opening is configured to be connected to external components and capable of being sealed such that a low pressure environment can be sustained within each passageway such that the low-pressure environment is a vacuum; and a first and a second magnet positioned along opposite and exterior surfaces of each of the passageways wherein the first and second magnets impose a magnetic field in a transverse direction with respect to a lengthwise axis of each of the passageways, the transverse magnetic field tending to reduce the potential energy of charged particles traveling through each of the passageways.

10. A high voltage system having at least two components that are each maintained at different DC voltage biases, the system comprising:

a vacuum chamber maintained at a very high DC electrical potential;

a vacuum pump maintained at a potential that is lower than the potential at which the vacuum chamber is maintained, the vacuum pump configured to create a vacuum within the vacuum chamber;

at least two voltage-isolating passageways that each connect the vacuum chamber and the vacuum pump, each of the voltage-isolating passageways including two openings wherein each opening has vacuum fitting seals, one of the openings of each passageway configured to be connected to the vacuum chamber and the other opening configured to be connected to the vacuum pump such that a vacuum can be sustained within each passageway; and a first and a second magnet positioned along opposite and exterior surfaces of the passageways wherein the first and second magnets impose a magnetic field in a transverse direction with respect to a lengthwise axis of each passageway, the transverse magnetic field tending to reduce the potential energy of charged particles traveling through each of the passageways.

11. A system as recited in claim 10 wherein each passageway is a continuous tubular structure.

12. A system as recited in claim 11 wherein the passageways substantially run along side each other.

13. A system as recited in claim 11 wherein each continuous tubular structure has an inner diameter of equal to or less than approximately 1 inch.

14. A system as recited in claim 13 wherein each continuous tubular structure has an inner diameter of approximately ⅛ inch.

15. A system as recited in claim 10 wherein a gas-feed system is also connected to each one of the passageways and a gas flows through each of the passageways.

16. A high voltage system as recited in claim 10 wherein the voltage-isolating passageway further comprises a semi-conductive material layer that coats an inner surface of the passageway, the semi-conductive material layer acting to absorb at least some of the charged particles that come into physical contact with the inner surface of the passageway.

17. A high voltage system as recited in claim 10 wherein the first and second magnets are oriented such that opposite poles face each other across the passageway.

18. A high voltage system as recited in claim 10 wherein the vacuum chamber contains an electron microscope.

19. A method for voltage isolation comprising:

guiding a gas along at least two pathways such that the gas flows from a first external component to a second external component; and directing a magnetic field through each of the pathways in a transverse direction with respect to a lengthwise axis of each of the pathways in order to reduce the potential energy of charged particles within the gas as the gas travels through each of the pathways.

20. A method as recited in claim 19 further comprising:

providing at least two continuous tubular structures that each define a respective one of the pathways.

21. A method as recited in claim 20 wherein the operation of directing a magnetic field is performed by a first and a second magnet positioned along opposite and exterior surfaces of each of the continuous tubular structures.

22. A method as recited in claim 20 further comprising:

maintaining a low pressure environment within each of the continuous tubular structures.

23. A method as recited in claim 20 further comprising:

configuring each of the continuous tubular structures to substantially run along side of each other.

24. A method as recited in claim 20 wherein each continuous tubular structure has an inner diameter of equal to or less than approximately 1 inch.

25. A method as recited in claim 24 wherein each continuous tubular structure has an inner diameter of approximately ⅛ inch.

26. A method as recited in claim 19 wherein the first external component is a gas-feed system.

27. A voltage-isolating apparatus comprising:

at least two passageways, each passageway having a first opening and a second opening arranged at opposite ends of the passageway wherein each opening is configured to be connected to external components and capable of being sealed such that a low pressure environment having few charged particles can be sustained within each passageway and such that the few charged particles travel in a direction from the first opening to the second opening; and a first and a second magnet positioned along opposite and exterior surfaces of each of the passageways such that they extend along a lengthwise axis of each passageway, wherein said lengthwise axis extending in a direction between the first and second openings and wherein the first and second magnets impose a magnetic field that is transverse to the lengthwise axis of each of the passageways over substantially the entire length of each passageway and wherein the transverse magnetic field tends to reduce the potential energy of charged particles traveling through each of the passageways.

* * * * *